United States Patent
Link et al.

(10) Patent No.: US 10,919,467 B2
(45) Date of Patent: Feb. 16, 2021

(54) HV BATTERY ARRANGEMENT FOR A MOTOR VEHICLE, ONBOARD NETWORK, MOTOR VEHICLE, AND METHOD FOR CONTROLLING AN HV BATTERY ARRANGEMENT

(71) Applicant: AUDI AG, Ingolstadt (DE)

(72) Inventors: Bernhard Link, Ingolstadt (DE); Thomas Glass, Mainburg (DE)

(73) Assignee: AUDI AG, Ingolstadt (DE)

( * ) Notice: Subject to any disclaimer, the term of this patent is extended or adjusted under 35 U.S.C. 154(b) by 151 days.

(21) Appl. No.: 16/194,635

(22) Filed: Nov. 19, 2018

(65) Prior Publication Data
US 2019/0176729 A1    Jun. 13, 2019

(30) Foreign Application Priority Data

Dec. 7, 2017   (DE) .......................... 102017222192.5

(51) Int. Cl.
*B60L 58/18*    (2019.01)
*B60R 16/033*    (2006.01)
(Continued)

(52) U.S. Cl.
CPC ............ *B60R 16/033* (2013.01); *B60L 50/51* (2019.02); *B60L 58/18* (2019.02); *B60L 58/22* (2019.02);
(Continued)

(58) Field of Classification Search
CPC .. B60R 16/033; G01R 31/396; H01M 10/425; H01M 10/441; B60L 58/21;
(Continued)

(56) References Cited

U.S. PATENT DOCUMENTS 3,886,426 A * 5/1975 Daggett .................. B60L 15/04
320/117
4,274,043 A * 6/1981 Heitz ................ H01M 10/4207
307/151
(Continued)

FOREIGN PATENT DOCUMENTS

DE   10 2009 000 676 A1   8/2010
DE      102011011799 A1   8/2012
(Continued)

OTHER PUBLICATIONS

German Search Report dated Dec. 5, 2019, in connection with corresponding DE Application No. 10 2017 222 192.5 (23 pgs., including machine-generated English translation).

*Primary Examiner* — John T Trischler
(74) *Attorney, Agent, or Firm* — Maier & Maier, PLLC

(57) ABSTRACT

An HV battery arrangement with a first HV battery unit that can be electrically coupled to a first HV onboard network part having a first drive unit of the motor vehicle, and with a second HV battery unit that can be electrically coupled to a second HV onboard network part having a second drive unit of the motor vehicle, wherein, between the first HV battery unit and the second HV battery unit, a switching device is arranged, by which the first and the second HV battery units can be connected in series and can be electrically disconnected from each other. The HV battery arrangement further has a control unit for actuating at least the switching device.

6 Claims, 5 Drawing Sheets

(51) Int. Cl.
  *G01R 31/396* (2019.01)
  *B60L 58/22* (2019.01)
  *B60L 50/51* (2019.01)
  *H01M 10/42* (2006.01)
  *H01M 10/44* (2006.01)

(52) U.S. Cl.
  CPC ........ *G01R 31/396* (2019.01); *H01M 10/425* (2013.01); *H01M 10/441* (2013.01); *H01M 2220/20* (2013.01)

(58) Field of Classification Search
  CPC .......... B60L 58/19; B60L 58/18; B60L 58/22; B60L 50/51
  USPC ........................................................ 320/104
  See application file for complete search history.

(56) References Cited

U.S. PATENT DOCUMENTS

| | | | | |
|---|---|---|---|---|
| 4,360,766 A * | 11/1982 | Bogardus, Jr. | .......... | B60L 58/18 318/139 |
| 4,616,170 A * | 10/1986 | Urstoger | ............... | H01M 10/44 320/119 |
| 5,177,425 A * | 1/1993 | Goto | .................. | H01M 10/441 320/130 |
| 6,140,799 A * | 10/2000 | Thomasson | ......... | H01M 10/441 320/117 |
| 6,342,775 B1 * | 1/2002 | Sleder, Sr. | ................ | H02J 5/00 320/116 |
| 6,674,180 B2 * | 1/2004 | Gale | ....................... | B60L 58/21 290/7 |
| 6,737,756 B1 * | 5/2004 | Gale | ....................... | B60L 58/21 290/7 |
| 6,741,065 B1 * | 5/2004 | Ishii | ........................ | B60L 58/15 320/122 |
| 6,930,404 B1 * | 8/2005 | Gale | ....................... | B60L 58/21 290/40 C |
| 7,439,631 B2 * | 10/2008 | Endou | ..................... | H02J 7/345 307/9.1 |
| 7,692,404 B2 * | 4/2010 | Harris | ....................... | B60L 7/14 320/117 |
| 8,179,650 B2 * | 5/2012 | Watanabe | ........... | H01M 10/482 361/93.1 |
| 8,442,727 B2 * | 5/2013 | Yamamoto | ............ | H02J 7/0029 701/49 |
| 8,618,771 B2 * | 12/2013 | Ichikawa | .............. | B60L 15/007 320/109 |
| 8,723,457 B2 * | 5/2014 | Komatsu | ................ | B60L 58/20 318/139 |
| 8,912,757 B2 * | 12/2014 | Fink | ...................... | H01M 10/44 320/117 |
| 9,006,920 B2 * | 4/2015 | Favaretto | .................. | B60L 3/04 307/9.1 |
| 9,045,047 B2 * | 6/2015 | Ito | ....................... | B60L 11/1816 |
| 9,065,280 B2 * | 6/2015 | Workman | ........... | H02J 7/0013 |
| 9,172,254 B2 * | 10/2015 | Ganor | ..................... | B60L 58/18 |
| 9,276,422 B2 * | 3/2016 | Hotta | .................. | H01M 10/425 |
| 9,379,553 B2 * | 6/2016 | Feuerstack | ........... | H02J 7/0013 |
| 9,385,542 B2 * | 7/2016 | Chang | .................. | H02J 7/0016 |
| 9,444,118 B2 * | 9/2016 | Kim | ................ | H01M 10/0445 |
| 9,450,274 B2 * | 9/2016 | Vo | ........................ | H02J 7/0024 |
| 9,525,291 B1 * | 12/2016 | Huynh | ...................... | H02P 6/12 |
| 9,564,767 B2 * | 2/2017 | Takahashi | ............. | H02J 7/0024 |
| 9,579,961 B2 * | 2/2017 | Harris | ..................... | B60L 53/14 |
| 9,673,431 B2 * | 6/2017 | Despesse | ........... | H01M 2/1072 |
| 9,770,996 B2 * | 9/2017 | Chen | ...................... | B60L 58/19 |
| 9,776,529 B2 * | 10/2017 | Jestin | ...................... | B60L 50/51 |
| 9,783,078 B2 * | 10/2017 | Huynh | ........................ | H02P 3/14 |
| 9,944,188 B2 * | 4/2018 | Reichow | ................ | B60L 53/00 |
| 10,029,632 B2 * | 7/2018 | Fink | ........................ | B60L 58/12 |
| 10,074,997 B2 * | 9/2018 | Vo | ............................ | H02J 7/0016 |
| 10,110,023 B2 * | 10/2018 | Magagnin | .............. | H02J 7/0063 |
| 10,186,734 B2 * | 1/2019 | Erlbacher | ................ | B60L 50/64 |
| 10,193,359 B2 * | 1/2019 | Ganor | ...................... | H02J 7/00 |
| 10,427,547 B2 * | 10/2019 | Syouda | .................. | B60L 58/19 |
| 10,505,439 B2 * | 12/2019 | Gotz | ................... | H02P 29/0241 |
| 10,651,660 B2 * | 5/2020 | Ganor | ...................... | H02J 7/00 |
| 2003/0071466 A1 * | 4/2003 | Gale | ....................... | B60L 58/21 290/40 C |
| 2003/0122512 A1 * | 7/2003 | Auerbach | ................. | B60L 7/16 318/139 |
| 2007/0273209 A1 * | 11/2007 | Endou | ..................... | B60L 50/40 307/45 |
| 2008/0174274 A1 * | 7/2008 | Kosaka | .................. | H02J 7/1423 320/117 |
| 2008/0285193 A1 * | 11/2008 | Watanabe | ........... | H01M 10/482 361/88 |
| 2009/0021216 A1 * | 1/2009 | Hills | ..................... | H02J 7/0013 320/134 |
| 2009/0078481 A1 * | 3/2009 | Harris | ..................... | B60L 58/21 180/65.1 |
| 2009/0128158 A1 * | 5/2009 | Kawai | .................... | B60L 58/24 324/433 |
| 2009/0140694 A1 * | 6/2009 | Zeng | ...................... | H02J 7/0016 320/118 |
| 2010/0315043 A1 * | 12/2010 | Chau | .................... | B60L 11/1851 320/134 |
| 2011/0001456 A1 * | 1/2011 | Wang | .................... | H02J 7/0016 320/117 |
| 2011/0130907 A1 * | 6/2011 | Gau | ........................ | B60K 6/28 701/22 |
| 2011/0285351 A1 * | 11/2011 | Fink | .................... | H01M 10/441 320/117 |
| 2012/0001480 A1 * | 1/2012 | Favaretto | ............... | H02J 7/0016 307/9.1 |
| 2012/0056478 A1 * | 3/2012 | Omoto | .................... | B60L 58/10 307/11 |
| 2012/0274140 A1 * | 11/2012 | Ganor | ............... | H01M 10/0445 307/71 |
| 2012/0299549 A1 * | 11/2012 | Kim | .................... | H01M 10/441 320/118 |
| 2012/0313584 A1 * | 12/2012 | Sugiyama | ............... | B60L 50/61 320/119 |
| 2012/0326654 A1 * | 12/2012 | Ito | .......................... | B60L 53/53 320/103 |
| 2013/0020863 A1 * | 1/2013 | Sugiyama | ............... | B60L 50/51 307/9.1 |
| 2013/0300370 A1 * | 11/2013 | Hotta | .................... | H01M 10/482 320/117 |
| 2013/0317661 A1 * | 11/2013 | Feuerstack | ............. | H01G 11/72 700/295 |
| 2013/0320926 A1 * | 12/2013 | Kerfoot, Jr. | ........... | H01M 10/44 320/117 |
| 2014/0091751 A1 * | 4/2014 | Workman | ............. | H02J 7/0024 320/106 |
| 2014/0184162 A1 * | 7/2014 | Takahashi | ............. | H02J 7/0069 320/128 |
| 2014/0312828 A1 * | 10/2014 | Vo | ........................... | H02J 7/342 320/103 |
| 2015/0222132 A1 * | 8/2015 | Shikatani | ............. | H01M 10/441 320/117 |
| 2015/0239366 A1 * | 8/2015 | Jestin | ..................... | B60L 58/14 307/10.1 |
| 2015/0314694 A1 * | 11/2015 | Alakula | .................. | B60L 50/51 320/117 |
| 2015/0357680 A1 * | 12/2015 | Erlbacher | ................ | B60L 3/0046 429/50 |
| 2015/0380959 A1 * | 12/2015 | Chang | ................... | H02J 7/0026 320/118 |
| 2016/0001664 A1 * | 1/2016 | Roth | ....................... | B60L 53/14 318/139 |
| 2016/0020443 A1 * | 1/2016 | White | ................... | H01M 2/1061 318/245 |
| 2016/0185225 A1 * | 6/2016 | Namuduri | .......... | B60L 15/2054 701/22 |
| 2016/0185230 A1 * | 6/2016 | Reichow | ................ | B60L 11/02 307/10.1 |
| 2016/0211680 A1 * | 7/2016 | Ganor | ...................... | H02J 7/00 |
| 2016/0315485 A1 * | 10/2016 | Magagnin | .............. | H02J 7/0013 |

(56) References Cited

U.S. PATENT DOCUMENTS

| | | | |
|---|---|---|---|
| 2017/0001585 A1* | 1/2017 | Fink | B60R 16/04 |
| 2017/0092023 A1* | 3/2017 | Ishii | B60L 1/006 |
| 2017/0120770 A1* | 5/2017 | Huynh | B60L 3/04 |
| 2017/0305289 A1* | 10/2017 | Meitinger | H01M 10/441 |
| 2017/0368958 A1* | 12/2017 | Eun | H01M 10/486 |
| 2018/0056798 A1* | 3/2018 | Syouda | B60L 53/60 |
| 2018/0062402 A1* | 3/2018 | Syouda | H02J 7/0024 |
| 2018/0326855 A1* | 11/2018 | Poeppel | B60L 50/64 |
| 2019/0106002 A1* | 4/2019 | Gotz | H02M 1/32 |
| 2019/0106005 A1* | 4/2019 | Straber | B60L 58/19 |
| 2019/0109470 A1* | 4/2019 | Ganor | B60L 58/21 |
| 2019/0255967 A1* | 8/2019 | Doersam | H01M 10/441 |
| 2020/0161778 A1* | 5/2020 | Glass | F02B 37/04 |
| 2020/0180470 A1* | 6/2020 | Doersam | H02J 7/0024 |

FOREIGN PATENT DOCUMENTS

| | | |
|---|---|---|
| DE | 10 2012 003 309 A1 | 8/2013 |
| DE | 10 2014 109 430 A1 | 1/2016 |
| DE | 10 2015 004 119 A1 | 10/2016 |
| DE | 102012008687 B4 | 2/2017 |
| DE | 102016010990 A1 | 3/2017 |
| DE | 10 2016 011 894 A1 | 4/2017 |

* cited by examiner

HV BATTERY ARRANGEMENT FOR A MOTOR VEHICLE, ONBOARD NETWORK, MOTOR VEHICLE, AND METHOD FOR CONTROLLING AN HV BATTERY ARRANGEMENT

FIELD

The invention relates to an HV (high voltage) battery arrangement for a motor vehicle, wherein the HV battery arrangement has a first HV battery unit that can be electrically coupled to a first HV onboard network part, which has a first drive unit of the motor vehicle. Furthermore, the HV battery arrangement has a second HV battery unit that can be electrically coupled to a second HV onboard network part, which has a second drive unit of the motor vehicle. The invention also includes an onboard network with an HV battery arrangement as well as a motor vehicle and a method for controlling an HV battery arrangement.

BACKGROUND

Fundamentally, in the framework of the development relative to highly automated driving, the requirements placed on the failure safety of the HV onboard network are becoming ever more stringent. This has reached its peak in that, during highly automated driving, in the event of a failure, the HV network is supposed to be still available for several minutes even after the failure. However, this is directly contrary to the safety strategy in the case of lithium ion batteries, where, in the event of a failure, it is generally sought to switch off the battery to achieve a safe state.

Under consideration for achieving this goal is to make available at least a partial voltage in the event of a failure, by way of, for example, a tap in the middle of the HV battery. However, in the case of a failure, there are undefined voltage fluctuations and, in the event of a short circuit, the high currents can damage all HV contactors present in the current path, so that, even against the backdrop of a conventional failure response, switching the HV battery back on after the failure generally contradicts the safety strategy. In a similar way, DE 10 2011 011 799 A1 describes an energy storage system that has a plurality of energy storage strands connected in parallel, wherein each of the strands comprises at least one energy storage cell. When the operating state of an energy storage cell is registered as being faulty, only a part of the energy storage strands that include a faulty energy storage strand, said part comprising the energy storage cell with the faulty operating state, is switched off.

Furthermore, DE 10 2012 008 687 B4 describes an automobile with an HV energy supply system. In this case, the automobile has two HV intermediate circuits, at each of which an HV consuming device is connected. Each of these HV intermediate circuits is coupled here to an HV power source. The two HV power sources are thereby connected to a DC/DC converter for balancing the states of charge between the two HV power sources. This has the advantage that, by switching off the DC/DC converter, the two intermediate circuits can be disconnected from each other. Accordingly, an electric failure in one of the intermediate circuits can have no effect on the other intermediate circuit. In order to be able to design the DC/DC converter to be as compact and low cost as possible, it is provided that it is designed solely for transfer of small quantities of energy for charge balancing when the differences in charge between the two power sources are small. Furthermore, in the case of this automobile, a connector for connection of a charging device for the HV power sources is provided only in one of the two intermediate circuits. A charging current for a traction battery, which is present in the intermediate circuit without the connector, can thereby be conveyed by way of the DC/DC converter. Because the DC/DC converter is designed only for small charging currents, however, the charging operation takes a very long time in this case.

SUMMARY

The object of the present invention is to provide an HV battery arrangement for a motor vehicle, an onboard network for a motor vehicle, and a motor vehicle, as well as a method for controlling an HV battery arrangement, which allow both a high failure safety and an operation that is as efficient as possible, in particular in regard to charging situations.

An HV battery arrangement for a motor vehicle according to the invention has a first HV battery unit that can be electrically coupled to a first HV onboard network part of the motor vehicle, that is, to a part of the HV onboard network having a first drive unit, such as, for example, a first electric motor. Moreover, the HV battery arrangement also has a second HV battery unit that can be electrically coupled to a second HV onboard network part having a second drive unit of the motor vehicle, such as, for example, a second electric motor. Arranged between the first HV battery unit and the second HV battery unit, moreover, is a switching device, by means of which the first and second HV battery units can be connected in series and can be electrically disconnected from each other, wherein, furthermore, the HV battery arrangement has a control unit for actuating at least the switching devices, and wherein the control unit is designed to actuate the switching devices in such a way that the first and second HV battery units are electrically disconnected from each other in a defined state, which is different from a state in which the first and second HV battery units are charged by means of a coupling to an external power source.

As a result, it is advantageously possible, in the defined state, which preferably represents the normal drive operation when the HV battery arrangement is used in a motor vehicle, to operate the two HV battery units in a manner in which they are electrically disconnected from each other. This has the great advantage that, in the event that a failure occurs in one entity, that is, either in the first HV battery unit or in the second HV battery unit, the other entity remains available, even without interruption. As a result, in the event of a failure of one of the two HV battery units, it is always ensured that at least one of the two drive units, that is, either the first drive unit or the second drive unit, of the motor vehicle can be further operated in an unimpeded manner. Nonetheless, by way of the switching devices, which, for example, can be designed as switches and, in particular, as contactors, the possibility of electrically connecting the first and second HV battery units to each other is provided. This allows, in turn, especially advantageous adjustment possibilities in regard to various charging modes, which will be explained in detail below. To cite one example, the switching devices make it possible, for example, to connect the two HV battery units in series for charging. In this way, it is possible to couple the two HV battery units, which are connected in series, to an electrical power source external to the vehicle, as a result of which a markedly faster charging is made possible in comparison to when an [energy] transfer from one of the two HV battery units to the other HV battery unit is effected by means of an intervening DC/DC converter.

In an advantageous embodiment of the invention, the first HV battery unit has two first connectors for coupling a respective first and second pole of the first HV battery unit to the first HV onboard network part. Moreover, the first HV battery unit has two second connectors for coupling the respective first and second pole of the first HV battery unit to a charging socket. In addition, the first HV battery unit has two first switching elements, by means of which the first pole and the second pole can each be coupled to the first connectors and decoupled from them. The first HV battery unit also has two second switching elements, by means of which the first pole and the second pole of the first HV battery unit can each be coupled separately to the second connectors and decoupled from them. Furthermore, the second HV battery unit can be designed in a totally analogous manner. This means that the second HV battery unit also preferably has two third connectors for coupling a respective first and second pole of the second HV battery unit to the second HV onboard network part, two fourth connectors for coupling the respective first and second pole of the second HV battery unit to the charging socket, and two third switching elements, by means of which the first pole and the second pole of the second HV battery unit can each be coupled to the third connectors and can be decoupled from them, as well as two fourth switching elements, by means of which the first pole and the second pole of the second HV battery unit can each be coupled separately to the fourth connectors and can be decoupled from them. Furthermore, one of the respective second connectors is electrically connected to a respective one of the fourth connectors.

In other words, each of the two HV battery units has connectors for coupling to the respectively associated HV onboard network part. Furthermore, corresponding switching elements are also provided, in particular, main connectors, through which the connection of the respective poles of the HV battery units can be disconnected from the associated HV onboard network part. By opening the first switching elements of the first battery unit, it is therefore possible correspondingly to sever the poles of the first HV battery unit from the first connectors, which represent the connection to the first HV onboard network part. The two poles of the first HV battery unit can also be coupled to a charging socket, with this coupling occurring via corresponding second connectors of the first HV battery unit. A severing of the connection of the poles of the first HV battery unit to these second connectors and, accordingly, to the charging socket can take place by opening corresponding second switching elements of the first HV battery unit. These second switching elements can therefore also be designed as a contactors. It is additionally advantageous when a disconnection of the battery poles of the first HV battery unit from the second connectors, in particular, also a disconnection from the second switching elements, can also take place by opening the first switching elements. This can be accomplished by arranging the first and second switching elements in series connection between the poles of the first HV battery unit and the second connectors and, for this purpose, by arranging the first switching elements closer to the poles of the first HV battery unit than the second switching elements. Due to these switching elements, it is possible in any desired way for a coupling to the first HV onboard network part as well as a disconnection from it to take place, and also for a coupling to a charging socket to take place and, in the same way, also a disconnection from this charging socket. Moreover, still more advantageous connection possibilities are provided and will be explained in detail below. The second HV battery unit is designed in a totally analogous manner and likewise has corresponding switching elements, in particular the third and fourth switching elements, which can likewise be designed as contactors and make possible a coupling to and disconnection from the second HV onboard network part as well as a coupling to and disconnection from the charging socket. Furthermore, it is advantageous when the particular one of the second connectors is electrically connected to the particular one of the fourth connectors. In particular, the particular one of the second connectors that is connected to the plus pole of the first HV battery unit—that is, when the first switching elements and second switching elements are correspondingly closed—is also electrically connected to the one of the fourth connectors that is connected to the plus pole of the second HV battery unit when the switch elements are correspondingly closed. The same also applies to the second and fourth connectors, which can be coupled to the minus poles.

The provision of these switching elements in the described positions is thereby especially advantageous, because, through appropriate actuation of these switching elements, a large number of switching variations are possible, which allow an optimization and adaptation to a given charging situation or to the drive operation. In particular, in this case, it is possible, for example, to connect the first HV battery unit and the second HV battery unit in parallel or also in series for charging, depending on the situation, and, in particular, for the drive operation, as described in the introduction, to disconnect them electrically from each other. These advantages ensue especially from the fact that, in the meantime, there are a large number of different charging possibilities for charging an HV battery—in this example, for charging the HV battery units—by means of external power sources. For example, the above-mentioned charging socket is used for charging the HV battery units by coupling the charging socket to a corresponding charging plug of a charging station or charging column. A direct current is usually provided at such charging stations. However, the voltages provided by such charging stations may differ. For example, there are charging stations that make possible a charging with approximately 400 volts; others make possible a charging with approximately 800 volts. There are meanwhile also charging possibilities at conventional household sockets or at one or more phases of a high-power connector in the household. An alternating current voltage or an alternating current is thereby supplied by such an external power source, however, which first needs to be converted into an appropriate direct current for charging. For this purpose, in turn, a corresponding charging device of the motor vehicle is required. The above-described switching elements of the respective HV battery units as well as the switching device present between the two HV battery units then make possible, in an especially advantageous way, diverse adaptation possibilities at all of the various charging situations described, which will be explained in detail below.

In an advantageous embodiment of the invention, the control unit is designed to actuate the first, second, third, and fourth switching elements and the switching devices between the first and second HV battery units in such a way that, in a first charging mode of the HV battery arrangement, in which the first HV battery unit and the second HV battery unit are charged by a power source that is externally coupled to the charging socket and supplies a first direct current voltage, the first and second HV battery units are connected in parallel to each other. In particular, this is especially advantageous when this first direct current voltage, which is supplied by the external power source, corresponds to the total voltage that can be tapped at a particular one of the two HV battery units. Preferably, the first and the second HV battery units are designed in such a way that they can each supply a battery voltage of 400 volts. Accordingly, in this case, this would mean that also the first direct current voltage that is supplied by the external power source, such as, for example, a charging station, is approximately 400 volts. By way of the parallel connections of the two HV battery units in this first charging mode, it is also possible to bring about the situation that, for charging these two HV battery units, a charging voltage of 400 volts is then applied at the respective connectors, in particular at the second and the fourth connectors. In order to create such parallel connections, preferably the first, second, third, and fourth switching elements and the switching device are controlled in such a way that the first, second, third, and fourth switching elements are closed and the switching device between the first and second HV battery units is opened.

In another advantageous embodiment of the invention, the control unit is designed to actuate the first, second, third, and fourth switching elements and the switching devices between the first and second HV battery units in such a way that, in a second charging mode of the HV battery arrangement, in which the first and second HV battery units are charged by a power source that is externally coupled to the charging socket and supplies a second direct current voltage of 800 volts, for example, the first and second HV battery units are connected to each other in series. This series connection is especially advantageous when a charging voltage supplied by the external power source, such as, for example, a charging station, corresponds to twice the battery voltage that can be tapped at one of the respective HV battery units, because, in this way, the charging can be speeded up.

In other words, if a charging voltage of 400 volts is supplied through a charging column, then the corresponding switching elements and switching devices can be controlled in such a way that the HV battery units are charged in a parallel connection, whereas, when 800 volts are supplied by a charging column, the individual HV battery units are advantageously connected in series for charging. In order to connect the first and second HV battery units in series, the control unit is designed to actuate the switching elements and the switching devices in such a way that the first and the third switching elements, the switching device between the first and the second HV battery units, and, in each case, only one of the second and fourth switching elements are closed and, in each case, the others of the second and fourth switching elements are opened.

Also possible in accordance with the next exemplary embodiment is an especially advantageous adaptation possibility for charging the first and second HV battery units by a charging device of a motor vehicle that can be coupled to an alternating current source as an external power supply. In this case, such a charging device of the motor vehicle can be coupled to one of the first connectors and one of the third connectors of the first and second HV battery units. In this case, the charging device of the motor vehicle is connected to these connectors in such a way that, in particular, a plus pole of the charging device is coupled to the plus connector of the first connectors, and a minus pole of the charging device is coupled to the minus connector of the third connectors. In accordance with an alternative connection possibility, a plus pole of the charging device can also be coupled to the plus connector of the third connectors, and the minus pole of the charging device can be coupled to the minus connector of the first connectors. Here, a plus connector or a minus connector of the first and third connectors refers to the first and third connectors that can be coupled to the relevant plus or minus pole of the respective HV battery units. Now, in order to charge the respective HV battery units by way of an external alternating current source or alternating voltage source that can be coupled to such charging device of the motor vehicle, the following embodiment of the invention is especially advantageous: The control unit is designed here to actuate the first, second, third, and fourth switching elements and the switching device between the first and second HV battery units in such a way that, in a third charging mode of the HV battery arrangement, in which the first and second HV battery units are charged by a power source that is externally coupled to a charging device of the motor vehicle and that supplies a specific alternating current voltage, the first and second HV battery units are connected to each other in series. This can be accomplished, for example, in that the control unit actuates the switching elements and the switching devices in such a way that the first and the third switching elements as well as the switching device arranged between the first and second HV battery units are closed and the second and fourth switching elements are opened. As a result, the HV battery arrangement can be adapted especially advantageously for charging by means of an external alternating voltage source. In this case, the charging device is preferably designed as an 800-volt alternating voltage charging device.

Furthermore, the invention also relates to an onboard network for a motor vehicle with an HV battery arrangement according to the invention or one of its embodiments. In addition to the HV battery arrangement according to the invention or one of its embodiments, the onboard network may comprise, in addition, the first HV onboard network part, which is then coupled to the first connectors of the first HV battery unit, as well as the second HV onboard network part, which is then coupled only to the third connectors of the second HV battery unit, as well as, optionally, also the charging socket with a first charging socket connector and a second charging socket connector, wherein the first charging socket connector is then connected to one of the second connectors and one of the fourth connectors of the HV battery units, and the second charging socket connector is connected to the other ones of the second and fourth connectors of the HV battery units. Furthermore, the onboard network can also have the charging device with a first charging device connector and with a second charging device connector, wherein the first charging device connector is connected to only one of the first connectors of the first HV battery unit and the second charging device connector is connected to only one of the third and complementary poled connectors of the second HV battery unit. In this way, the onboard network makes possible the above-described advantageous charging variants as well as also the electric disconnection and isolation of the two HV battery units in normal drive operation of the motor vehicle.

Furthermore, it is advantageous when the onboard network has a third onboard network part, such as, for example, an MV onboard network and/or an LV onboard network, such as, for example, a 12-volt onboard network and/or a 48-volt onboard network. In general, this third onboard network part has a voltage level that is lower than that of the first and second HV onboard network part, wherein the onboard network further has a first converter device between the first HV onboard network part and the third onboard network part as well as a second converter device between the second HV onboard network part and the third onboard network part. These respective converter devices, which preferably are designed as DC/DC converters and, in particular as galvanically isolated DC/DC converters, are preferably designed to convert the HV voltages supplied by the respective HV battery units, such as, for example, 400 volts, to the lower voltage level, such as, for example, 48 volts and/or 12 volts, of the third onboard network part. As a result, the third onboard network part can be supplied with energy, at the same time, also via the first HV battery unit and/or the second HV battery unit. By way of these converter devices, it is also possible, as needed, for an energy transfer to occur to the respective HV battery units, such as, for example, in order to balance differences in charge between the two HV battery units. Alternatively or additionally, differences in charge between the two HV battery units can also be balanced by way of the drive operation itself. This can take place through appropriate actuation of the two drive units of the motor vehicle, that is, of the two electric motors. If the two HV battery units are unequally charged, for example, then this can be balanced by a correspondingly unequal power demand by the respective drive units. This can also take place not only by appropriate actuation of the electric motors, but also, alternatively or additionally, by other HV consuming devices.

The onboard network can have, in addition, the two drive units described, that is, the first drive unit and the second drive unit, each of which can be designed as an electric motor. In addition, it is also possible for each of the respective electric motors to be provided with a corresponding power electronics unit, which is supplied with energy by the respectively associated HV battery units.

Furthermore, the invention also relates to a motor vehicle with an onboard network in accordance with the invention or one of its embodiments.

Moreover, the invention also relates to a method for controlling an HV battery arrangement for a motor vehicle, which has a first HV battery unit that can be electrically coupled to a first HV onboard network part having a first drive unit of the motor vehicle, and has a second HV battery unit that can be electrically coupled to a second HV onboard network part having a second drive unit of the motor vehicle. Moreover, a control unit of the HV battery arrangement controls a switching device arranged between the first HV battery unit and the second HV battery unit, by means of which the first HV battery unit and the second HV battery unit can be connected in series and can be electrically disconnected from each other in such a way that the first and second HV battery units are electrically disconnected from each other in a defined state that is different from a state in which the first and the second HV battery units are charged by means of a coupling to an external power source.

The advantages described in regard to the HV battery arrangement according to the invention and the HV onboard network according to the invention and in regard to the embodiments thereof apply advantageously in the same way to the method according to the invention. Moreover, the substantive features mentioned in connection with the HV battery arrangement according to the invention and the embodiments thereof, as well as in connection with the onboard network according to the invention and its embodiments make possible the enhancement of the method according to the invention through additional corresponding method steps.

The invention also comprises combinations of the exemplary embodiments described.

The invention also includes enhancements of the method according to the invention that have features such as those already described in connection with the enhancements of the motor vehicle according to the invention. For this reason, the corresponding enhancements of the method according to the invention are not described here once again.

BRIEF DESCRIPTION OF THE DRAWINGS

Exemplary embodiments of the invention are described below. Shown for this purpose are.

DETAILED DESCRIPTION

Figure 1:
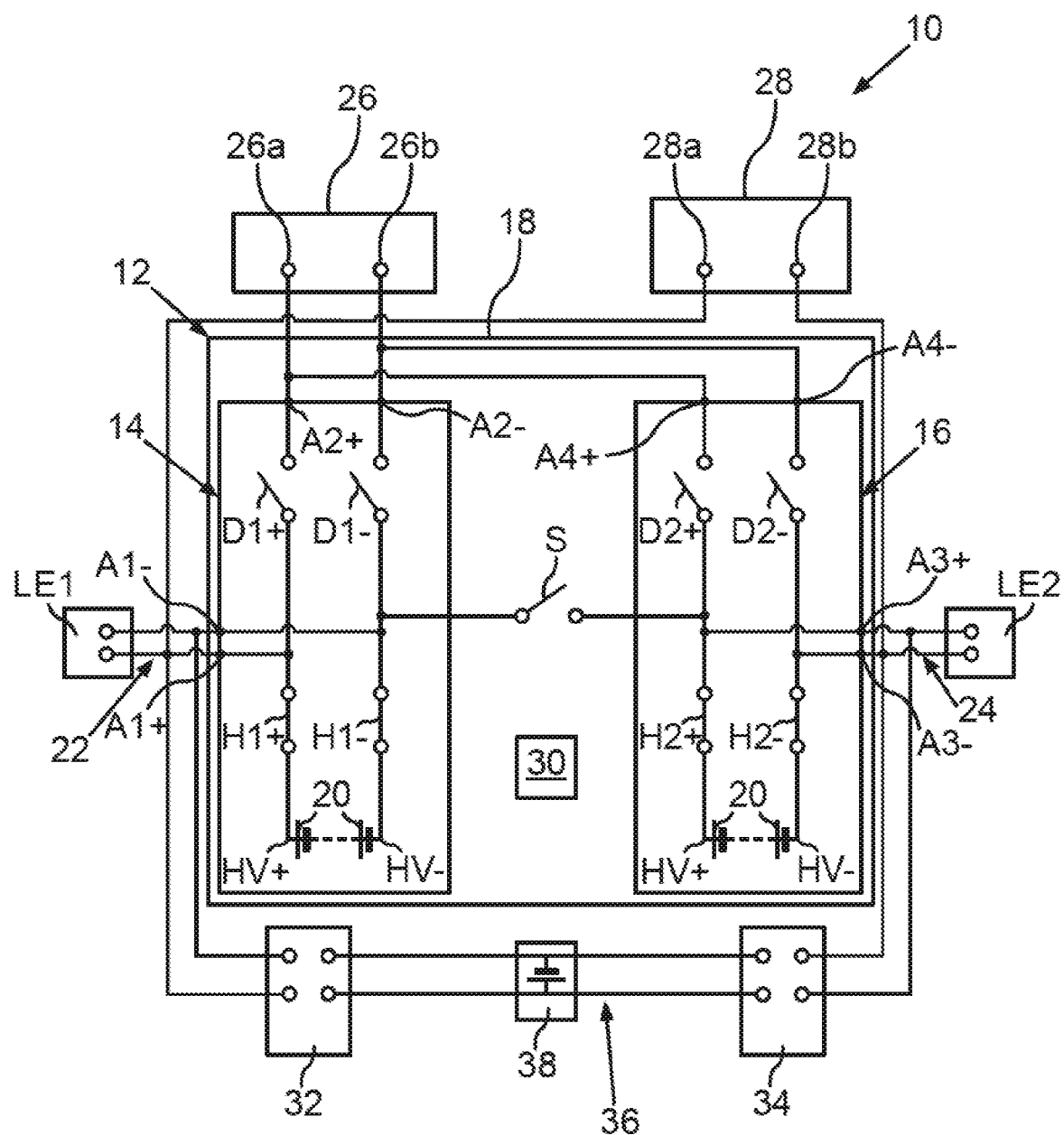
FIG. 1 a schematic illustration of an onboard network of a motor vehicle with an HV battery arrangement in a drive operation of the motor vehicle in accordance with an exemplary embodiment of the invention.

In the exemplary embodiment explained below, what is involved are preferred embodiments of the invention. In the exemplary embodiments, the described components of the embodiments each represent individual features that are to be regarded as independent of one another, each of which enhances the invention also independently of one another, and, accordingly, which are also to be regarded individually or in a combination different from that shown as being a part of the invention. Furthermore, the described embodiments can also be supplemented by features that are additional to those already described.

In the figures, functionally identical elements are each furnished with the same reference symbols.

FIG. 1, FIG. 2, FIG. 3, and FIG. 4 each show a schematic illustration of an onboard network 10 of a motor vehicle with an HV battery arrangement 12 in accordance with an exemplary embodiment of the invention. In this case, the HV battery arrangement 12 has a first HV battery unit 14 as well as a second HV battery unit 16. Both HV battery units 14, 16 can be arranged here in a common battery housing 18. The respective HV battery units 14, 16 in this case have a plurality of battery cells 20. These battery cells can be arranged here in series connections and/or in parallel connections. Also conceivable are diverse combinations of series and parallel connections of the individual battery cells 20. These battery cells 20 can be designed, for example, as lithium ion cells, as a result of which the respective HV battery units 14, 16 are provided as lithium ion batteries. Furthermore, a particular one of the HV battery units 14, 16 has a plus pole HV+ as well as a minus pole HV−. Between these two poles HV+, HV−, it is possible to tap a total voltage of 400 volts, for example, in each case. Furthermore, the onboard network 12 has a first HV onboard network part 22 and a second HV onboard network part 24. In this case, the first HV onboard network part 22 can be supplied with energy by the first HV battery unit 14 and the second HV onboard network part 24 can be supplied with energy by the second HV battery unit 16. In this case, the first and second HV onboard network parts 22, 24 can have respective HV consuming devices. Here, by way of example, the first HV onboard network part 22 has, as such an HV consuming device, at least one first power electronics unit LE1 for a power supply of a drive unit, which is not illustrated here and is preferably designed as an electric motor. Furthermore, the second HV onboard network part 24 has, as an HV consuming device, at least one second power electronics unit LE2 for the power supply of a second drive unit of the motor vehicle, which likewise is not illustrated here and which preferably likewise is designed as a second electric motor. In this case, the two electric motors can each be designed for driving the wheels at a front axle as well as the wheels of a rear axle of the motor vehicle. Furthermore, the first HV battery unit 14 has two first connectors A1+ and A1−, with it being possible to connect one of these two connectors A1+ to the plus pole HV+ of the first HV battery unit 14 and to connect the second of the first connectors A1− to the minus pole HV− of the first HV battery unit 14. Arranged between these first connectors A1+ and A1− and the respective poles HV+, HV− of the first HV battery unit 14 are, in particular, two first switching elements H1+, H1−, each of which is designed as a contactor. By opening these contactors H1+, H1−, the battery cells 20 of the first HV battery unit 14 can be disconnected from the rest of the onboard network 10. Furthermore, the first HV battery unit 14 also has two second connectors A2+, A2−, which, in turn, can be coupled to respective poles HV+, HV− of the first HV battery unit 14. This coupling can be severed, in particular, by way of two second switching elements D1+, D1−, which, in turn, are preferably designed as respective contactors and are arranged between the respective poles HV+, HV− of the first HV battery unit 14 and the respective second connectors A2+, A2−. These second connectors A2+, A2− are connected to a charging socket 26 of the motor vehicle, in particular, to a respective first charging socket connector 26a and to a second charging socket connector 26b. At this charging socket 26, it is possible, in particular, to connect a direct current power source external to the vehicle for charging the HV battery arrangement 12. Such an external power source can be provided, for example, by a charging column.

The second HV battery unit 16 is designed totally analogously to the first HV battery unit 14. The second HV battery unit 16 also has two third connectors A3+, A3−, by way of which the respective battery poles HV+, HV− of the second HV battery unit 16 can be coupled to the second HV onboard network part 24. This connection can be severed, in turn, in particular, by two third switching elements H2+, H2−, which preferably are likewise designed as contactors. Furthermore, the second HV battery unit 16 also has two fourth connectors A4+, A4−, which are connected to the corresponding charging socket connectors 26a, 26b of the charging socket 26. By way of two corresponding fourth switching elements D2+, D2−, in turn, the respective poles HV+, HV− of the second HV battery unit 16 can be coupled to the fourth connectors A4+, A4− or disconnected from them. These fourth switching elements D2+, D2− are also preferably designed as contactors.

Furthermore, the onboard network 10 has a charging device 28. The charging device comprises, in turn, a first charging device connector 28a as well as a second charging device connector 28b. At this charging device 28, it is possible, in turn, to connect an external power source, which is then designed correspondingly as an alternating current source or alternating voltage source. The charging device 28 is correspondingly designed to convert the alternating current voltage supplied by the external power source or the supplied alternating current to a direct current voltage that is suitable for charging the HV battery arrangement 12 or to a suitable direct current. In particular, this charging device 28 is preferably designed as an 800-volt alternating current charging device. Furthermore, the first charging device connector 28a, which represents a plus connector, is connected to the HV plus potential of the first HV onboard network part 22, which is connected to the corresponding plus connector of the first connector A1+. The other charging device connector 28b is correspondingly connected to the negative HV potential of the second HV onboard network part 24, which, in turn, is connected to the negative connector, that is, to the third connector A3−, which is coupled to the minus pole of the second HV battery unit 16.

It is specially advantageous when, between the first and second HV battery units 14, 16, a switching device S is then arranged, which, in turn, is preferably designed as a contactor. By way of this switching device S, it is advantageously possible for the first and the second HV battery units 14, 16 to be electrically disconnected from each other.

This is the case, in particular, in normal drive operation, such as illustrated in FIG. 1. In this example, the switching device S is correspondingly opened. As a result, during drive operation, two completely independent entities are provided by the first and second HV battery units 14, 16. Accordingly, a failure in one of these entities cannot affect the other of these two entities. The other entity can thus remain available without interruption. Therefore, if, for any reason, one of these two HV battery units 14, 16 fails, a power supply of the corresponding HV onboard network part 22, 24 and thus of at least one of the two electric motors continues to be provided by the other of these two HV battery units 14, 16, thereby ensuring further travel of the motor vehicle even in the event of a failure of one of the two HV batteries units 14, 16.

In contrast, in a charging situation in which the HV battery arrangement 12 is being charged by an external power source, these switching devices S can be closed, as needed, in order to provide advantageous adjustment possibilities for different charging situations. The actuation of the respective switching elements H1+, H1−, D1+, D1−, H2+, H2−, D2+, D2− and the switching devices S is assumed in this case by a control unit 30 of the HV battery arrangement 12.

In normal drive operation, as is illustrated in FIG. 1, therefore, the switching device S between the two HV battery units 14, 16 is opened, as described. Furthermore, the second switching elements D1+, D1− of the first HV battery unit 14 as well as the fourth switching elements D2+, D2− of the second HV battery unit 16 are also opened, because, in this situation, no charging by an external power source takes place. For operation of the respective drive devices in normal drive operation, the first switching elements H1+, H1− and the third switching elements H2+, H2− are correspondingly closed.

Figure 2:
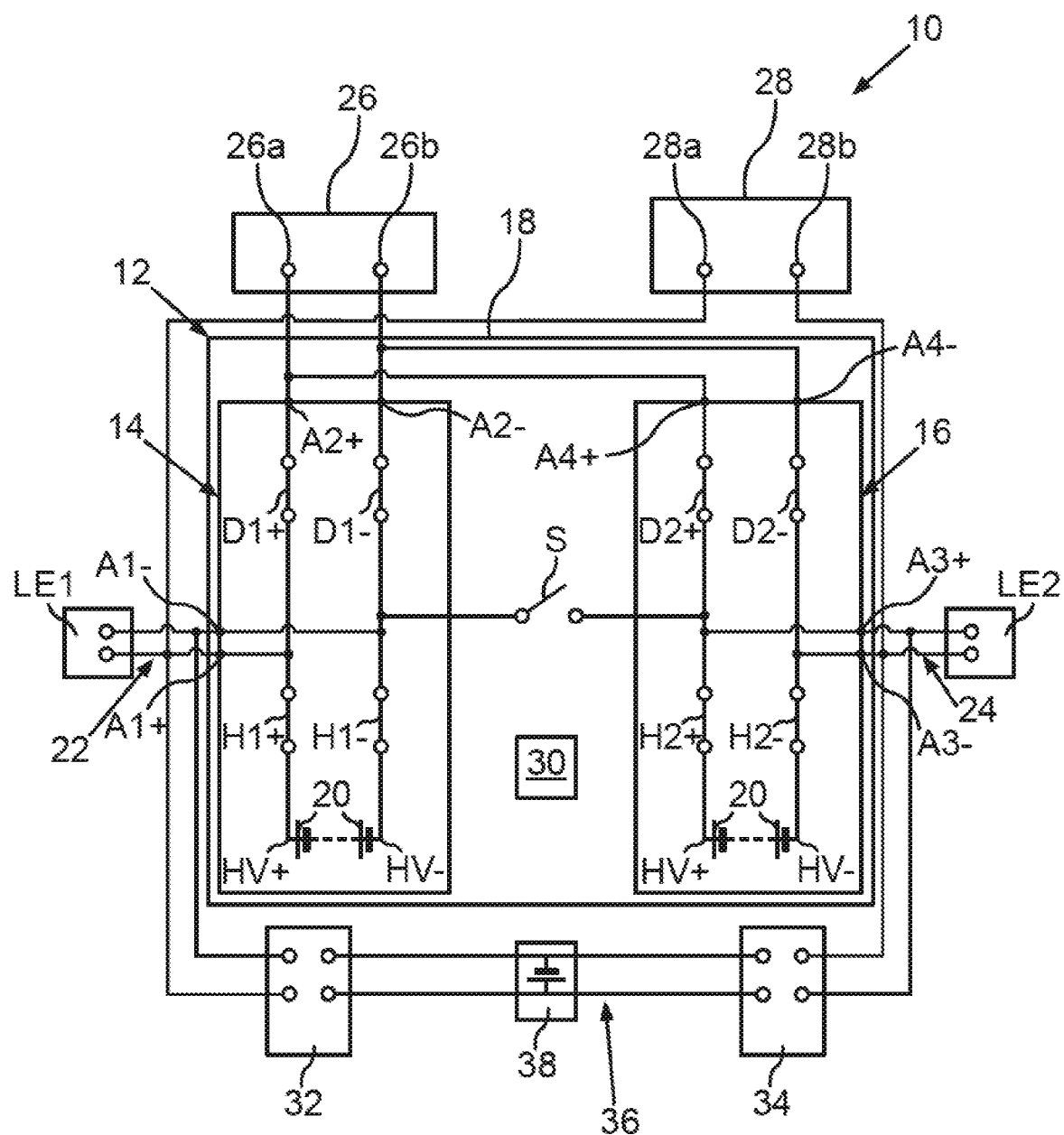
FIG. 2 a schematic illustration of an onboard network of a motor vehicle with an HV battery arrangement in a first charging mode in accordance with an exemplary embodiment of the invention.
Figure 3:
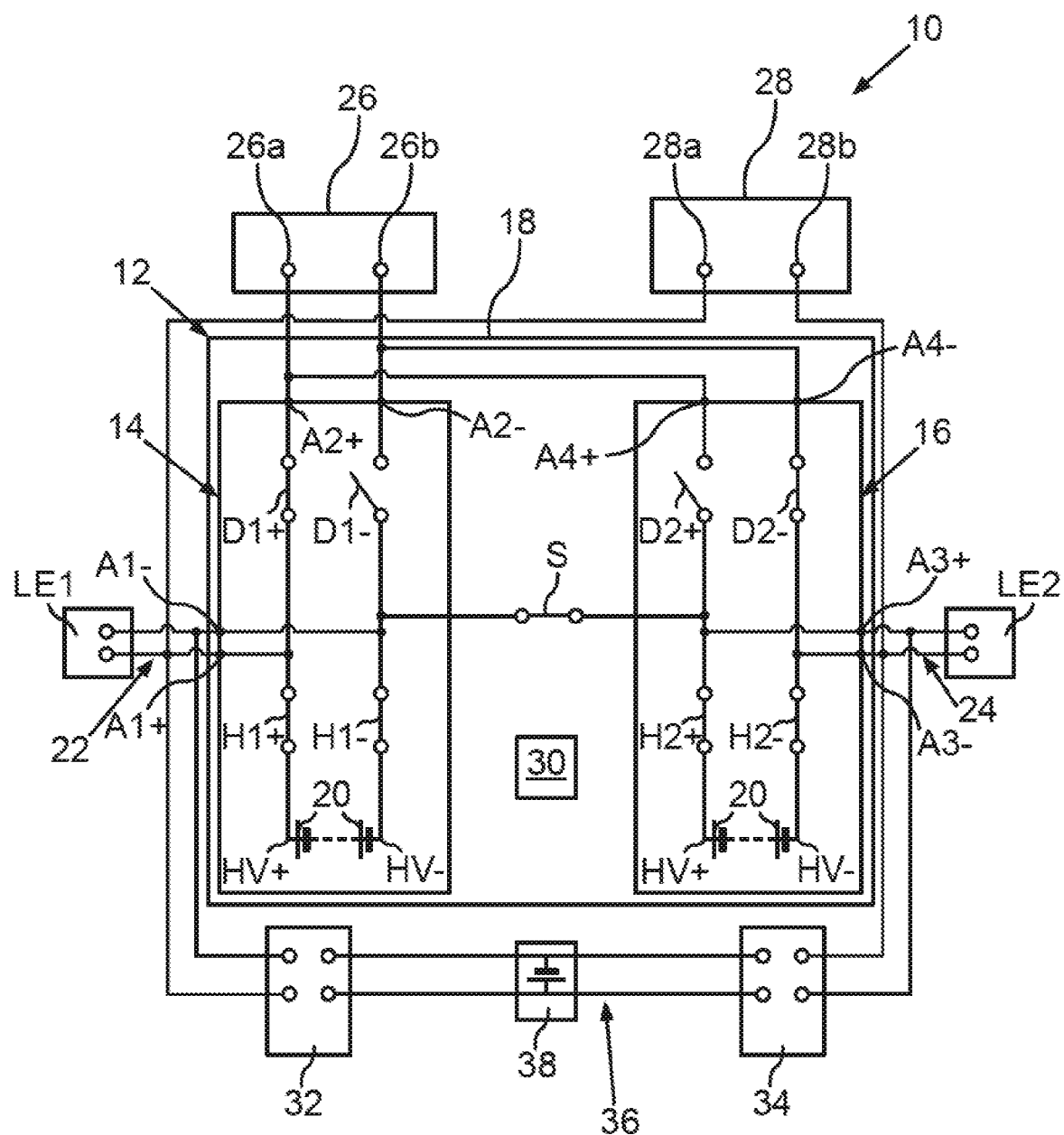
FIG. 3 a schematic illustration of an onboard network of a motor vehicle with an HV battery arrangement in a second charging mode in accordance with an exemplary embodiment of the invention.

FIG. 2 shows the corresponding situation in a first charging mode of the HV battery arrangement 12, in which the HV battery arrangement 12 is being charged by an external power source, which is coupled to the charging socket 26 and, in this example, supplies a direct current voltage of approximately 400 volts. In this case, the switching device S remains opened, whereas all other switching elements H1+, H1−, H2+, H2−, D1+, D1−, D2+, D2− are closed. In other words, the two HV battery units 14, 16 are connected in parallel to each other for charging with a direct current voltage of 400 volts. However, there are also external power sources, in particular charging columns that do not supply a 400-volt direct current voltage, but instead supply an 800-volt direct current voltage. This second charging mode is illustrated in FIG. 3.

In this second charging mode, the switching device S and the respective switching elements H1+, H1−, H2+, H2−, D1+, D1−, D2+, D2− are actuated in such a way that the switching device S is closed, the first switching elements H1+, H1−, H2+", the third switching elements H2+, H2−, and, in each case, one of the second and one of the fourth switching elements D1+, D2− are closed, whereas the other elements of the second and fourth switching elements D1−, D2+ are opened. In this way, the first and second HV battery units 14, 16 are connected to each other in series for charging. Through this series connection, it is possible for the two HV battery units 14, 16 to be charged faster at suitable charging columns, that is, at those that supply a charging voltage of 800 volts, because the limiting criterion at the DC charging stations with high charging capacity, such as, for example, 800 volts, is the maximum charging current.

Figure 4:
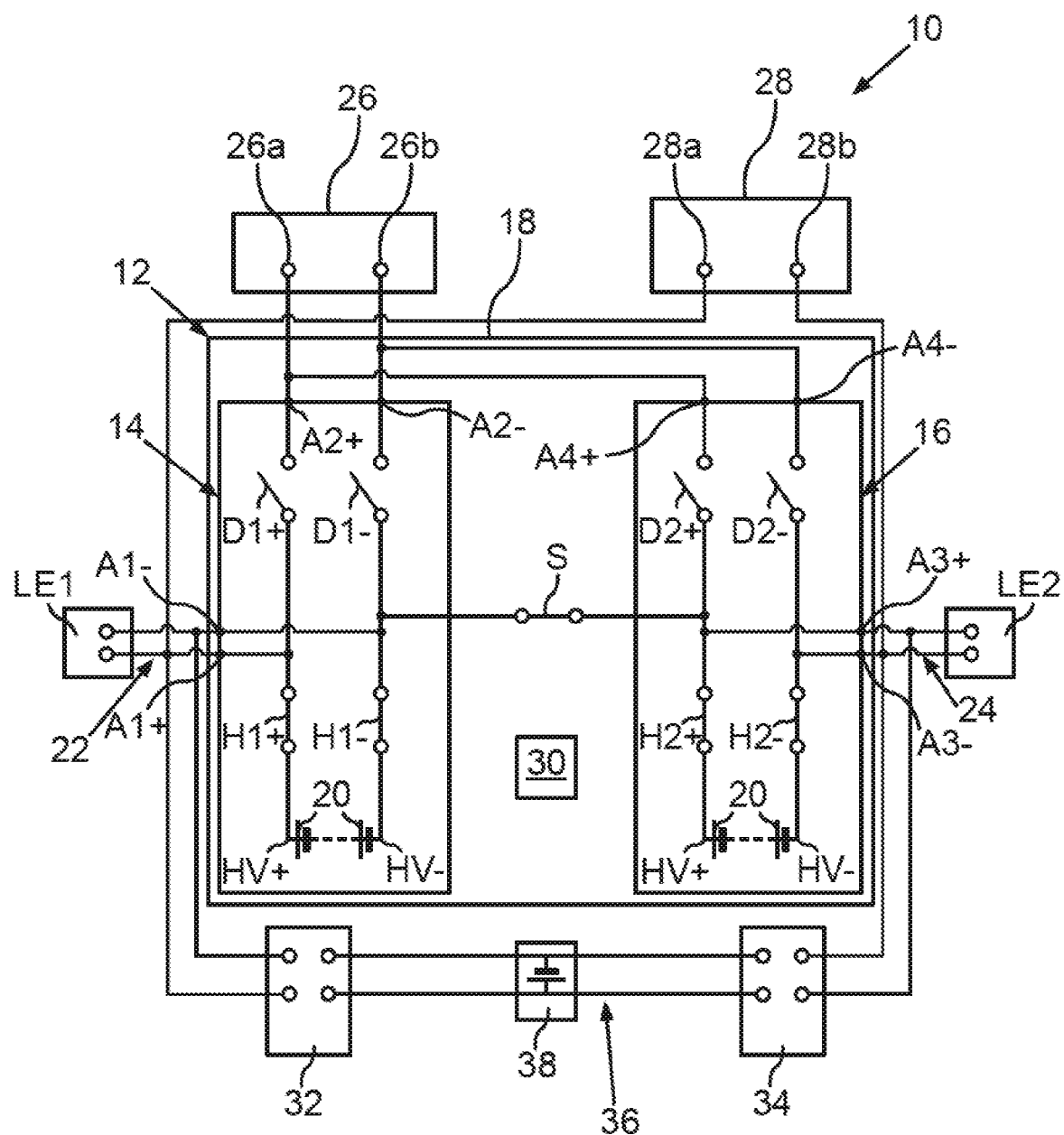
FIG. 4 a schematic illustration of an onboard network of a motor vehicle with an HV battery arrangement in a third charging mode in accordance with an exemplary embodiment of the invention.

In contrast, FIG. 4 shows the situation in which, in accordance with a third charging mode, the HV battery arrangement 12 is charged by an external alternating voltage source coupled to the charging device 28. In this situation, in turn, the switching device S is closed, as are also the first and third switching elements H1+, H1−, H2+, H2−. The second and fourth switching elements D1+, D1−, D2+, D2− are opened in this case. Accordingly, the first and second HV battery units 14, 16, in turn, are coupled to the corresponding charging device connectors 28a, 28b in a series connection. For alternating current charging, the two HV battery units 14, 16 are therefore connected in series to the alternating current charging device 28 by way of closing the switching device S.

Furthermore, it is advantageous when two converter devices 32, 34, which, in particular, are designed as respective DC/DC converters, are further provided. In this case, the first converter device 32 couples the first HV onboard network part 22 to a medium-voltage (MV) onboard network and/or to a low-voltage (LV) onboard network 36, whereas the second converter device 34 couples the second HV onboard network part 24 to this MV onboard network and/or LV onboard network 36. Thus, a corresponding MV and/or LV onboard network can also be supplied with energy by the respective HV battery unit 14, 16. This MV onboard network or LV onboard network 36 can still have a corresponding MV battery or LV battery, such as, for example, a 48-volt battery or a 12-volt battery 38 as well as additional consuming devices, which are not illustrated. In the case of different states of charge, the first and second HV battery units 14, 16 can continue advantageously to balance, that is, to compensate, the state of charge via these two converter devices 32, 34. Alternatively or additionally, this balancing can also take place through an appropriate control of the respective drive units in order to balance the state of charge of the two HV battery units 14, 16 by a corresponding drive operation. As a result, in drive operation, a balancing of the state of charge of the two HV battery units 14, 16 can take place, as needed, either by way of the two electric motors and the roadway or by way of the two DC/DC converters 32, 34.

As described above, the two HV battery units 14, 16 are connected in parallel to the charging socket 26 during DC charging with approximately 400 volts. In the case of different states of charge, the HV battery units 14, 16 can be connected to the higher state of charge only with a time delay.

For DC charging with approximately 800 volts, the two batteries are connected in series to the charging socket 26, as described. Here, too, in the case of different states of charge, the HV battery unit 14, 16 can be connected to the higher state of charge only with a time delay.

In the case of AC charging, the HV battery units 14, 16 can be balanced in the case of different states of charge by way of the two DC/DC converters 32, 34.

Figure 5:
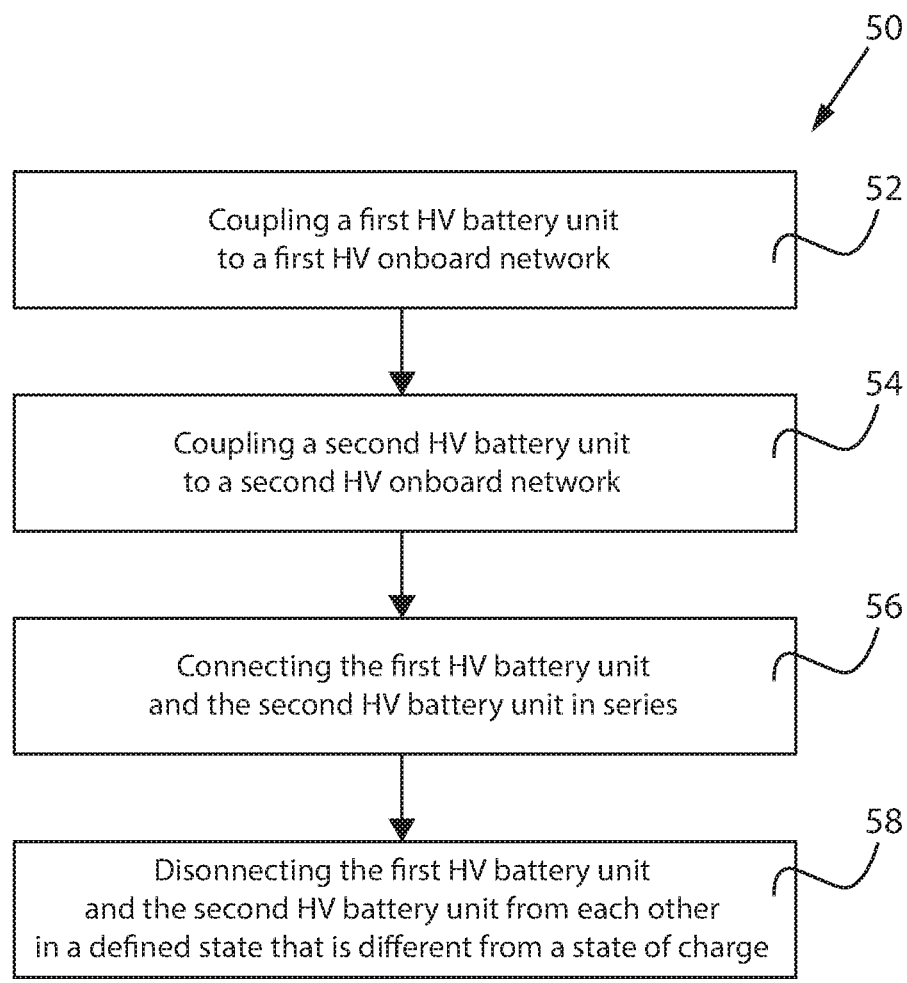
FIG. 5 a schematic illustration of a method for controlling an HV battery for a motor vehicle.

FIG. 5 may show a method 50 for controlling an HV battery for a motor vehicle. At step 52 a first HV battery unit may be coupled to a first HV onboard network. At step 54 a second HV battery unit may be coupled to a second HV onboard network. At step 56, the first HV battery unit and the second HV battery unit may be connected in series. At step 58, the first HV battery unit and the second HV battery unit may be disconnected from each other in a defined state that is different from a state of charge.

Overall, the examples show how, by means the invention, an HV battery arrangement as well as a corresponding onboard network and a motor vehicle can be provided, which, through the independence of two HV battery units, can provide an especially failsafe power supply for the HV onboard network, and which, through the possibility of also electrically connecting the two HV battery units to each other, provide especially advantageous charging possibilities.

The invention claimed is:

1. An HV battery arrangement for a motor vehicle, comprising:
a first HV battery unit that can be electrically coupled to a first HV onboard network part having a first drive unit of the motor vehicle,
a second HV battery unit that can be electrically coupled to a second HV onboard network part having a second drive unit of the motor vehicle, wherein between the first HV battery unit and the second HV battery unit, a switching device is arranged, by which the first and the second HV battery units can be connected in series and can be electrically disconnected from each other, wherein the HV battery arrangement further has a control unit for actuating at least the switching device, and wherein the control unit is designed for the purpose of controlling the switching device in such a way that the first and second HV battery units are electrically disconnected in a defined state that is different from a state in which the first and second HV battery units are charged by a coupling to an external power source;
two first connectors for coupling a respective first and second pole of the first HV battery unit to the first HV onboard network part;
two second connectors for coupling the respective first and second pole of the first HV battery unit to a charging socket;
two first switching elements, by which the first and second pole can each be coupled to the first connectors and can be decoupled from them;
two second switching elements, by which the first and second pole of the first HV battery unit can each be separately coupled to the second connectors and can be decoupled from them;
and wherein the second HV battery unit further comprising:

two third connectors for coupling a respective first and second pole of the second HV battery unit to the second HV onboard network part;

two fourth connectors for coupling the respective first and second pole of the second HV battery unit to the charging socket;

two third switching elements, by which the first and second pole of the second HV battery unit can each be coupled to the third connectors and can be decoupled from them; and two fourth switching elements, by which the first and second pole of the second HV battery unit can each be separately coupled to the fourth connectors and can be decoupled from them;

wherein a particular one of the second connectors is electrically connected to a particular one of the fourth connectors.

2. An onboard network for a motor vehicle having an HV battery arrangement according to claim 1.

3. The onboard network according to claim 2, further comprising:

a third onboard network part, which has a voltage level that is lower than that of the first and second HV onboard network parts, wherein the onboard network further has a first converter device between the first HV onboard network part and the third onboard network part as well as a second converter device between the second HV onboard network part and the third onboard network part.

4. The HV battery arrangement according to claim 1, wherein the control unit is designed for the purpose of actuating the first, second, third, and fourth switching elements and the switching device between the first and second HV battery units in a plurality of modes, wherein in a first charging mode of the HV battery arrangement, in which the first and second HV battery units are charged by an external power source that is coupled to the charging socket, which supplies a first direct current voltage, the first and second HV battery units are connected in parallel to each other.

5. The HV battery arrangement according to claim 4, wherein in a second charging mode of the HV battery arrangement, in which the first and second HV battery units are charged by an external power source that is coupled to the charging socket, which supplies a second direct current voltage, the first and the second HV battery units are connected to each other in series.

6. The HV battery arrangement according to claim 5, wherein in a third charging mode of the HV battery arrangement, in which the first and second HV battery units are charged by an external power source that is coupled to a charging device of the motor vehicle, which supplies a specific alternating current voltage, the first and the second HV battery units are connected to each other in series.

* * * * *